United States Patent
Shu et al.

(10) Patent No.: US 10,546,885 B2
(45) Date of Patent: Jan. 28, 2020

(54) THIN FILM TRANSISTOR AND DISPLAY SUBSTRATE, FABRICATION METHOD THEREOF, AND DISPLAY DEVICE

(71) Applicant: BOE TECHNOLOGY GROUP CO., LTD., Beijing (CN)

(72) Inventors: Shi Shu, Beijing (CN); Chuanxiang Xu, Beijing (CN); Teng Luo, Beijing (CN); Feng Gu, Beijing (CN); Bin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/768,634

(22) PCT Filed: Oct. 30, 2017

(86) PCT No.: PCT/CN2017/108322
§ 371 (c)(1),
(2) Date: Apr. 16, 2018

(87) PCT Pub. No.: WO2018/176829
PCT Pub. Date: Oct. 4, 2018

(65) Prior Publication Data
US 2019/0067340 A1 Feb. 28, 2019

(30) Foreign Application Priority Data
Mar. 29, 2017 (CN) .......................... 2017 1 0197332

(51) Int. Cl.
*H01L 27/12* (2006.01)
*G02F 1/1362* (2006.01)
(Continued)

(52) U.S. Cl.
CPC ........ *H01L 27/1288* (2013.01); *G02F 1/1362* (2013.01); *G02F 1/1368* (2013.01);
(Continued)

(58) Field of Classification Search
CPC ........... H01L 27/1288; H01L 29/78633; H01L 27/3244; H01L 27/3241; H01L 29/7869; G02F 1/136209
See application file for complete search history.

(56) References Cited

U.S. PATENT DOCUMENTS

2010/0315318 A1 12/2010 Lee et al.
2012/0001173 A1* 1/2012 Suzuki ............. H01L 29/66742
257/43
(Continued)

FOREIGN PATENT DOCUMENTS

| CN | 102683338 A | 9/2012 |
| CN | 103367458 A | 10/2013 |
| CN | 105655352 A | 6/2016 |

OTHER PUBLICATIONS

Machine Translation of CN 102683338.*
(Continued)

*Primary Examiner* — Julia Slutsker
(74) *Attorney, Agent, or Firm* — Westerman, Hattori, Daniels & Adrian, LLP (57) ABSTRACT

A method for fabricating a thin film transistor includes providing a substrate (100); forming a semiconductor layer (105) over the substrate (100); forming a source-drain metal layer (106) over the semiconductor layer (105); applying one patterning process to the semiconductor layer (105) and the source-drain metal layer (106) to form an active layer (1), a source electrode (2), and a drain electrode (3); forming a gate insulating layer (101) and an interlayer insulating layer (102) that cover the active layer (1), the source electrode (2), and the drain electrode (3); applying a patterning process to the interlayer insulating layer (102) to form a first window (10) in the interlayer insulating layer (102) to expose a portion of the gate insulating layer (101); and forming a gate electrode (4) in the first window (10). An (Continued)

orthogonal projection of the gate electrode (4) on the substrate (100) is in an orthogonal projection of the active layer (1) on the substrate (100).

8 Claims, 7 Drawing Sheets

(51) Int. Cl.
*H01L 29/417* (2006.01)
*H01L 29/423* (2006.01)
*H01L 29/66* (2006.01)
*H01L 29/786* (2006.01)
*G02F 1/1368* (2006.01)
*H01L 27/32* (2006.01)
*G02F 1/1343* (2006.01)
*H01L 21/02* (2006.01)
*H01L 21/30* (2006.01)

(52) U.S. Cl.
CPC .... *G02F 1/136227* (2013.01); *H01L 27/1262* (2013.01); *H01L 29/417* (2013.01); *H01L 29/42384* (2013.01); *H01L 29/66757* (2013.01); *H01L 29/78633* (2013.01); *H01L 29/78675* (2013.01); *G02F 1/134363* (2013.01); *G02F 1/136209* (2013.01); *G02F 2001/13685* (2013.01); *G02F 2001/136231* (2013.01); *G02F 2001/136236* (2013.01); *G02F 2202/104* (2013.01); *H01L 21/02592* (2013.01); *H01L 21/02675* (2013.01); *H01L 21/3003* (2013.01); *H01L 27/3241* (2013.01); *H01L 27/3244* (2013.01); *H01L 29/7869* (2013.01)

(56) References Cited

U.S. PATENT DOCUMENTS

| | | |
|---|---|---|
| 2016/0225879 A1 | 8/2016 | Lee |
| 2018/0182865 A1* | 6/2018 | Hao ........................ H01L 21/77 |
| 2018/0190686 A1* | 7/2018 | Zhang ............... H01L 29/66765 |
| 2018/0210587 A1* | 7/2018 | Zhang ................... G06F 3/0412 |

OTHER PUBLICATIONS

International Search Report dated Feb. 7, 2018, issued in counterpart application No. PCT/CN2017/108322. (12 pages).
Office Action dated Nov. 28, 2019, issued in counterpart CN application No. 201710197332.7, with English translation. (18 pages).

* cited by examiner

THIN FILM TRANSISTOR AND DISPLAY SUBSTRATE, FABRICATION METHOD THEREOF, AND DISPLAY DEVICE

CROSS-REFERENCE TO RELATED APPLICATION

This PCT patent application claims priority to Chinese Patent Application No. 201710197332.7, filed on Mar. 29, 2017, the entire contents of which are incorporated herein by reference.

TECHNICAL FIELD

The present disclosure generally relates to the field of display technologies and, more particularly, to a thin film transistor and a display substrate, a fabrication method thereof, and a display device.

BACKGROUND

A low temperature polysilicon (LTPS) material can serve as a semiconductor material for a high performance display device due to a high carrier mobility. However, a process for an LTPS array substrate is relatively difficult. In addition to that annealing uniformity control and doping control of an amorphous silicon are relatively difficult, the material needs to meet strict properties and thus increases a threshold of the technique. Thus, a fabrication method having reduced number of masks needs to be developed, such that a production cost can be reduced.

SUMMARY

In one aspect, the present disclosure provides a method for fabricating a thin film transistor. The method includes providing a substrate; forming a semiconductor layer over the substrate; forming a source-drain metal layer over the semiconductor layer; applying one patterning process to the semiconductor layer and the source-drain metal layer to form an active layer, a source electrode, and a drain electrode; forming a gate insulating layer and an interlayer insulating layer that cover the active layer, the source electrode, and the drain electrode; applying a patterning process to the interlayer insulating layer to form a first window in the interlayer insulating layer to expose a portion of the gate insulating layer; and forming a gate electrode in the first window. An orthogonal projection of the gate electrode on the substrate is in an orthogonal projection of the active layer on the substrate.

Another aspect of the present disclosure provides a thin film transistor. The thin film transistor includes a substrate, an active layer over the substrate, a source electrode and a drain electrode over the substrate, a gate insulating layer, an interlayer insulating layer, and a gate electrode. The source electrode and the drain electrode are disposed over a surface of the active layer facing away from the substrate. Orthogonal projections of the source electrode and the drain electrode on the substrate are in an orthogonal projection of the active layer on the substrate. The gate insulating layer covers the active layer, the source electrode, and the drain electrode. The interlayer insulating layer is over the gate insulating layer. The interlayer insulating layer has a first window exposing a portion of the gate insulating layer. A gate electrode is in the first window. An orthogonal projection of the gate electrode on the substrate is located in the orthogonal projection of the active layer on the substrate.

BRIEF DESCRIPTION OF THE FIGURES

The following drawings are merely examples for illustrative purposes according to various disclosed embodiments and are not intended to limit the scope of the present disclosure.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

A display substrate is an important component of a flat panel display. A pixel-control switch and important parameters of display panel, e.g. resolution, refresh frequency, etc., may be related to a display substrate. The display substrate may include pixels as units. A pixel may include a semiconductor device. Properties of the semiconductor devices may determine a quality of the entire display panel. Displays may be developing toward large size, high resolution, and high frequency, which may need a high enough on-state current and a relatively low leakage current of the semiconductor device. A higher resolution and a higher frequency of display may need shorter charging time for a row of pixels, i.e., a pixel row. The on-state current of the semiconductor device may need to be increased in order to complete the charging in a shorter time. A method of increasing the on-state current of the semiconductor device may mainly include selecting a semiconductor material with a high carrier mobility.

Due to a high carrier mobility, a low temperature polysilicon (LTPS) material can serve as a semiconductor material for a high performance display device. Further, a driving circuit may be integrated on a glass substrate to achieve a narrow frame and a low power consumption. However, there may be some difficulties in a process for fabricating an LTPS array substrate. For example, annealing uniformity control and doping control of an amorphous silicon may be relatively difficult, and the material may need to meet strict properties and may thus increase a threshold of the technique.

The present disclosure provides a fabrication method for a thin film transistor. With the fabrication method, the number of masks used in the fabrication process can be reduced, the fabrication process can be simplified, and a production cost can be reduced.

Figure 1:
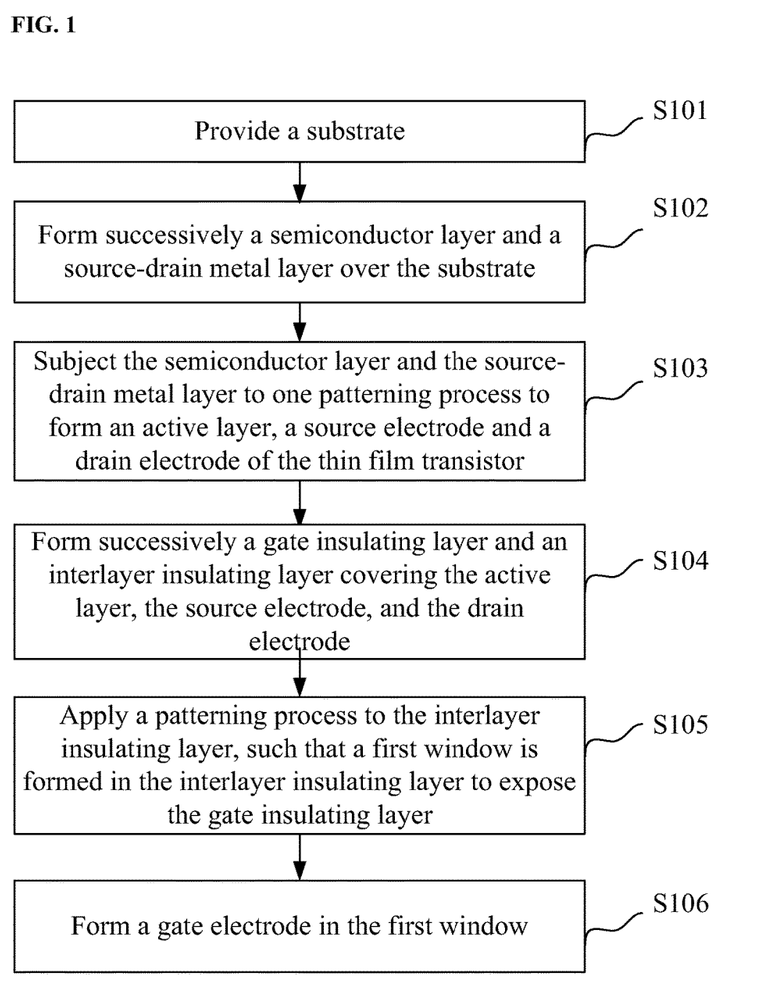
FIG. 1 illustrates a flow chart of an exemplary fabrication method of a thin film transistor according to various disclosed embodiments of the present disclosure.

With reference to FIG. 1, the fabrication method for the thin film transistor is described below.

At S101, a substrate is provided.

At S102, a semiconductor layer and a source-drain metal layer are formed successively over the substrate.

At S103, the semiconductor layer and the source-drain metal layer are subject to one patterning process to form an active layer, a source electrode, and a drain electrode of the thin film transistor.

In the above-described embodiments, the active layer, the source electrode, and the drain electrode of the thin film transistor may be formed through one patterning process, which is also referred to as a "one-time patterning process." During the one patterning process, only one mask is used, without the need for another mask. That is, one mask is used for forming the active layer, the source electrode, and the drain electrode. Therefore, the number of patterning processes can be reduced, and hence the number of masks needed for patterning can be reduced. As such, the fabrication process can be simplified, and a production cost can be reduced.

In some embodiments, a material of the active layer may include low-temperature polysilicon having a relatively high carrier mobility. In some other embodiments, the material of the active layer may include monocrystalline silicon, a metal oxide semiconductor material, or another suitable material.

In some embodiments, the technical solution of the present disclosure may be applicable to a top gate type thin film transistor. In some other embodiments, the technical solution of the present disclosure may be applicable to a bottom gate type thin film transistor.

The thin film transistor of the present disclosure may be applicable to, but is not limited to, a display device. The thin film transistor of the present disclosure may be applicable to, for example, an array substrate of a liquid crystal display device, and a display substrate of an organic electroluminescent display device.

In some embodiments, when the thin film transistor is a top gate type thin film transistor, the fabrication method may further include the following processes, as described below with reference to FIG. 1.

At S104, a gate insulating layer and an interlayer insulating layer covering the active layer, the source electrode, and the drain electrode are formed successively.

At S105, a patterning process is applied to the interlayer insulating layer, such that a first window is formed in the interlayer insulating layer to expose the gate insulating layer.

At S106, a gate electrode is formed in the first window. An orthogonal projection of the gate electrode on the substrate is in an orthogonal projection of the active layer on the substrate.

In the above-described embodiment, an interlayer insulating layer may be formed over the gate insulating layer before the gate electrode is formed, such that a parasitic capacitance between the gate electrode and the source/drain electrodes can be reduced. Further, the layered structure containing the gate insulating layer and the interlayer insulating layer may ensure a good etching selectivity between the gate insulating layer and the interlayer insulating layer.

In some embodiments, before forming the semiconductor layer and the source-drain metal layer, the fabrication method may further include the following processes.

A patterned light-blocking layer is formed over the substrate. An orthogonal projection of a portion of the active layer between the source electrode and the drain electrode on the substrate is in an orthogonal projection of the light-blocking layer on the substrate. In some embodiments, the orthogonal projection of the active layer on the substrate is in the orthogonal projection of the light-blocking layer on the substrate.

The active layer may have one side facing away from the source electrode and the drain electrode, and an opposing side facing toward the source electrode and the drain electrode. The light-blocking layer formed in the above-described process can block light coming from the side of the active layer facing away from the source electrode and the drain electrode, such that the light may not irradiate the active layer, and the semiconductor property of the active layer may not be influenced by light irradiation. In some embodiments, the light-blocking layer may be made of, for example, a light-blocking insulating material.

In some embodiments, when the semiconductor layer of the thin film transistor includes a polysilicon layer, the fabrication method may further include the following processes.

A buffer layer is formed over the light-blocking layer.

An amorphous silicon layer is formed over the buffer layer.

The amorphous silicon layer is subject to a dehydrogenation process and an excimer laser annealing process to form a polysilicon layer.

The buffer layer may be made of, for example, a silicon nitride material, a silicon oxide material, or a silicon oxynitride material. The buffer layer may have, for example, a monolayer structure or a composite layer structure, for preventing the light-blocking layer from influencing a performance of the semiconductor layer.

The present disclosure also provides a fabrication method for a display substrate including processes of fabricating a thin film transistor. In the present disclosure, in the fabrication method for a display substrate, the thin film transistor may be prepared using the fabrication method consistent with the present disclosure for a thin film transistor, such as any one of the above-described exemplary fabrication methods for a thin film transistor, such that the number of masks used in the fabrication process can be reduced, the fabrication process can be simplified, and the production cost can be reduced.

In some embodiments, when the display substrate is a thin film transistor array substrate, i.e., an array substrate having thin film transistors, the fabrication method may further include the following processes.

A passivation layer is formed over the thin film transistors.

A transparent conductive layer is formed over the passivation layer, and the transparent conductive layer is patterned to form a pixel electrode and a first electrode in a pixel.

A first via hole and a second via hole penetrating through the passivation layer, the interlayer insulating layer and the gate insulating layer are formed. The pixel electrode is electrically coupled to the drain electrode through the first via hole, and the first electrode is electrically coupled to the source electrode through the second via hole.

In the above process, the first and second via holes penetrating through the passivation layer, the interlayer insulating layer and the gate insulating layer may be formed by one etching process. Accordingly, the number of masks used in the fabrication process can be reduced. Further, when the pixel electrode is formed, the first electrode electrically coupled to the source electrode is formed. The first electrode can be used during testing for applying a test voltage to the source electrode.

For an array substrate of a transverse electric field type thin film transistor, before forming the passivation layer, the fabrication method may further include the following process.

A pattern of an organic insulating layer is formed over the thin film transistor. The organic insulating layer has a second window to expose at least a portion of the source electrode of the thin film transistor and at least a portion of the drain electrode of the thin film transistor.

A common electrode is formed between the organic insulating layer and the passivation layer.

In the above-described embodiment, before the common electrode is formed, a second window is formed in the organic insulating layer between the thin film transistor and the common electrode to expose at least a portion of a region where the source electrode of the thin film transistor is located and at least a portion of a region where the drain electrode of the thin film transistor is located. Accordingly, a thickness of the insulating layer between the pixel electrode and the drain electrode may be not increased, and a quality of the via holes penetrating through the passivation layer, the interlayer insulating layer, and the gate insulating layer may be not degraded.

Figure 12:
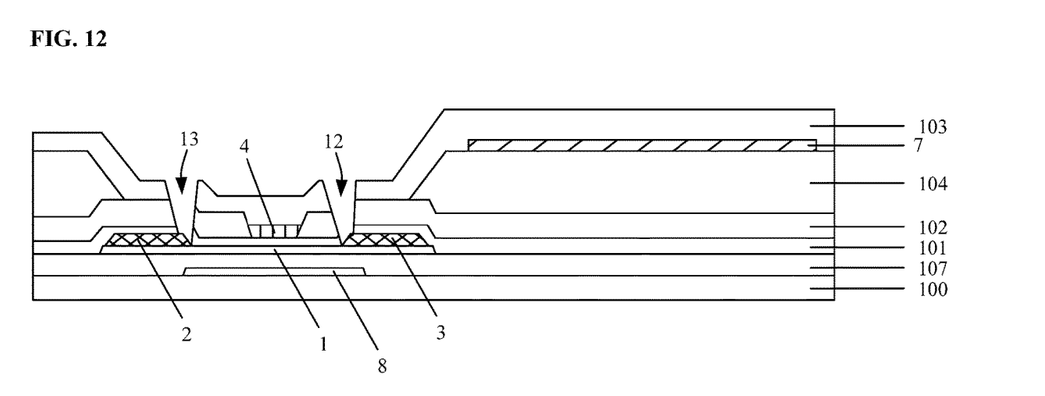
Figure 13:
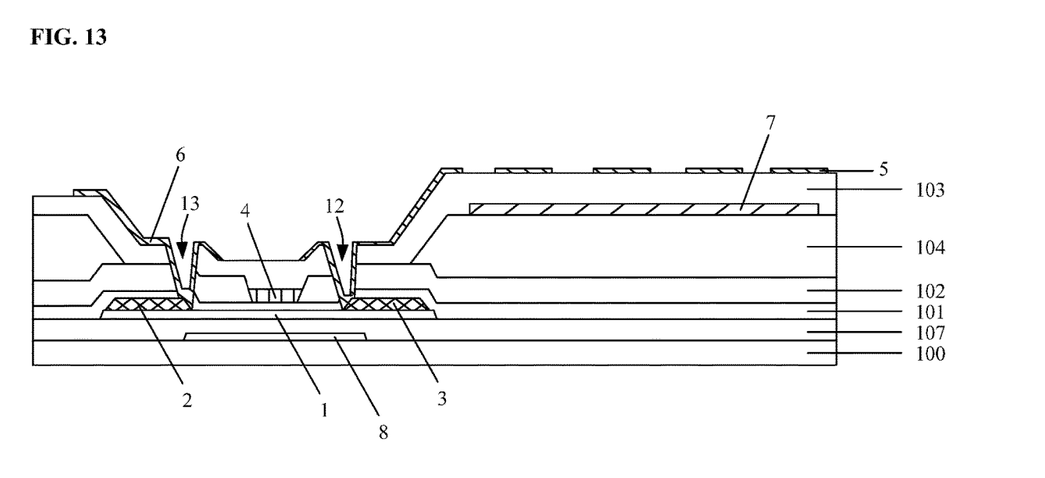
Figure 14:
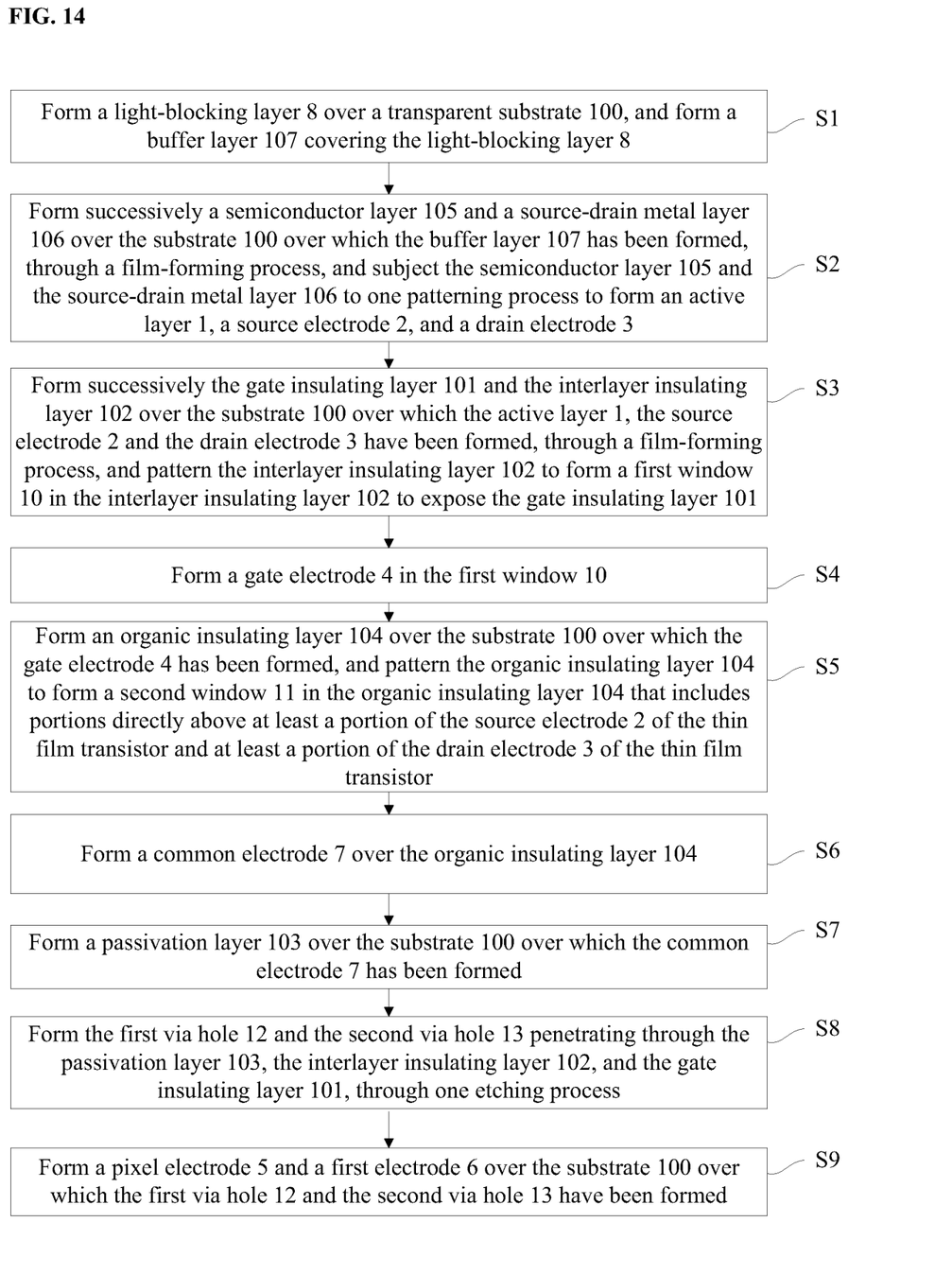
FIG. 14 illustrates a flow chart of an exemplary fabrication method of an exemplary display substrate according to various disclosed embodiments of the present disclosure.

FIGS. 2 to 13 illustrate exemplary structures at various stages of an exemplary process for fabricating an exemplary display substrate according to various disclosed embodiments of the present disclosure. FIG. 14 illustrates a flow chart of an exemplary fabrication method of an exemplary display substrate according to various disclosed embodiments of the present disclosure. With reference to FIGS. 2 to 13 and FIG. 14, a fabrication method for a display substrate is described below, taking an array substrate of a transverse electric field type thin film transistor as an example.

Figure 2:
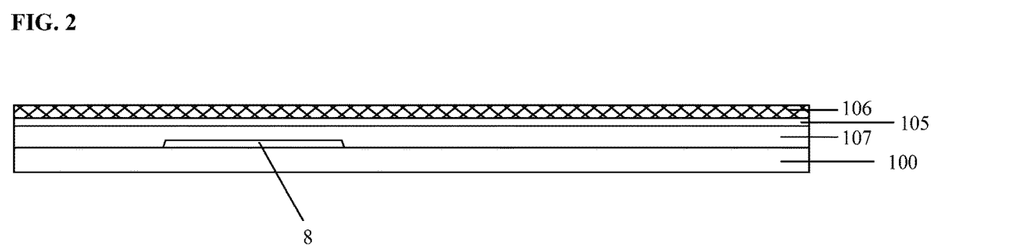
FIGS. 2 to 13 illustrate exemplary structures at various stages of an exemplary process for fabricating an exemplary display substrate according to various disclosed embodiments of the present disclosure.

At S1, a light-blocking layer 8 is formed over a transparent substrate 100, and a buffer layer 107 covering the light-blocking layer 8 is formed, as shown in FIG. 2.

The buffer layer 107 may include, for example, a monolayer structure or a composite layer structure made of one or more of silicon nitride, silicon oxide, silicon oxynitride, or anther suitable insulating material. Accordingly, the buffer layer 107 may prevent the light-blocking layer 8 from influencing the performance of the thin film transistor, and may provide a flat fabrication surface to the thin film transistor.

Figure 6:
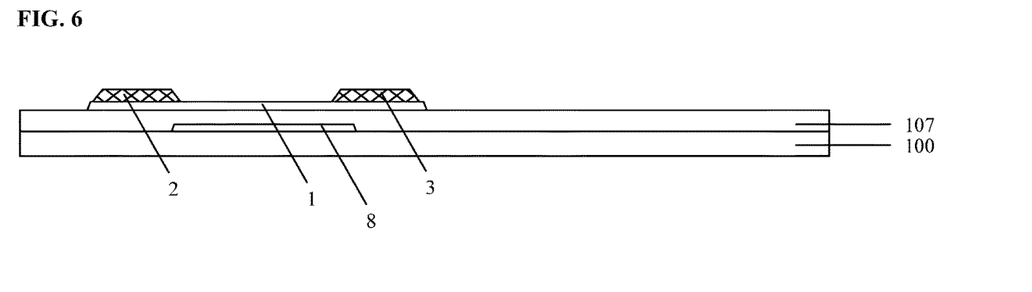

At S2, a semiconductor layer 105 and a source-drain metal layer 106 are successively formed over the substrate 100 over which the buffer layer 107 has been formed, through a film-forming process, e.g., deposition or sputtering, as shown in FIG. 2. The semiconductor layer 105 and the source-drain metal layer 106 are subject to one patterning process to form an active layer 1, a source electrode 2, and a drain electrode 3, as shown in FIG. 6.

A material of the active layer 1 may include, for example, low temperature polysilicon, or metal oxide semiconductor, e.g., Hf—In—Zn—O (HIZO), ZnO, $TiO_2$, CdSnO, MgZnO, In—Ga—O (IGO), Indium-Zinc-Oxide (IZO), Indium-Tin-oxide (ITO) or Indium-Gallium-Zinc-Oxide (IGZO).

In the embodiments that the active layer 1 is made of a low temperature polysilicon material, the semiconductor layer 105 may include a polysilicon layer. Accordingly, the process of forming the semiconductor layer 105 may include forming an amorphous silicon layer over the buffer layer 107, and then subjecting the amorphous silicon layer to a dehydrogenation process and an excimer laser annealing process to form the polysilicon layer 105.

The process of subjecting the semiconductor layer 105 and the source-drain metal layer 106 to one patterning process may include the following.

A photoresist 21 is formed over the source-drain metal layer 106, and the photoresist 21 is exposed and developed with a halftone or gray tone mask to form a pattern of the photoresist 21. The pattern of the photoresist 21 includes a photoresist-fully-retaining region, a photoresist-partially-retaining region, and a photoresist-free region. The photoresist-free region refers to a region without photoresist as a result of, e.g., being fully exposed during the exposure process. The photoresist-fully-retaining region refers to a region with most remaining photoresist as a result of, e.g., being not exposed during the exposure process under a protection of the mask. The photoresist-partially-retaining region refers to a region with some photoresist remained but less than that in the photoresist-fully-retaining region, as a result of, e.g., being partially exposed during the exposure due to the use of the halftone or gray tone mask. The photoresist in the photoresist-partially-retaining region may be removed by an ashing process. The photoresist-fully-retaining region corresponds to regions where the source electrode and the drain electrode are located. That is, an orthogonal projection of the photoresist-fully-retaining region on the substrate overlaps with orthogonal projections of the regions where the source electrode and the drain electrode are located on the substrate. The photoresist-partially-retaining region corresponds to a region between the source electrode and the drain electrode. That is, an orthogonal projection of the photoresist-partially-retaining region on the substrate overlaps with an orthogonal projection of the region between the source electrode and the drain electrode on the substrate. The photoresist-free region corresponds to other regions, i.e., regions other than the regions where the source electrode and the drain electrode are located and the region between the source electrode and the drain electrode. That is, an orthogonal projection of the photoresist-free region on the substrate overlaps with orthogonal projections of other regions on the substrate.

Figure 3:
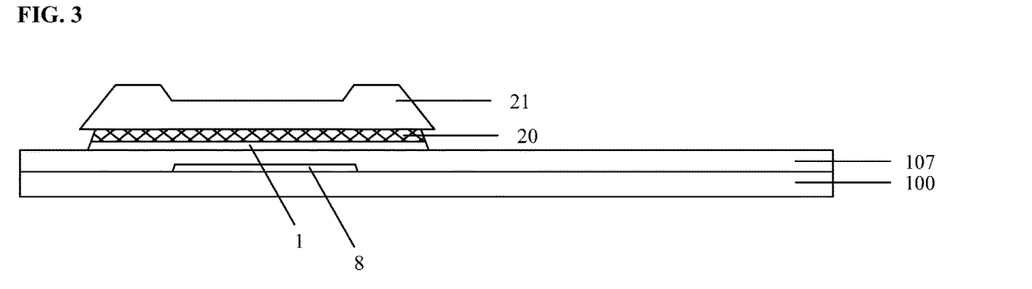

A portion of the semiconductor layer 105 and a portion of the source-drain metal layer 106 corresponding to the photoresist-free region are removed by an etching process to form a first pattern 20 of the source-drain metal layer and the active layer 1, as shown in FIG. 2 and FIG. 3. The portion of the semiconductor layer 105 corresponding to the photoresist-free region refers to a portion of the semiconductor layer 105 having an orthogonal projection on the substrate overlapping with the orthogonal projection of the photoresist-free region on the substrate. The portion of the source-drain metal layer 106 corresponding to the photoresist-free region refers to a portion of the source-drain metal layer 106 having an orthogonal projection on the substrate overlapping with the orthogonal projection of the photoresist-free region on the substrate.

Figure 4:
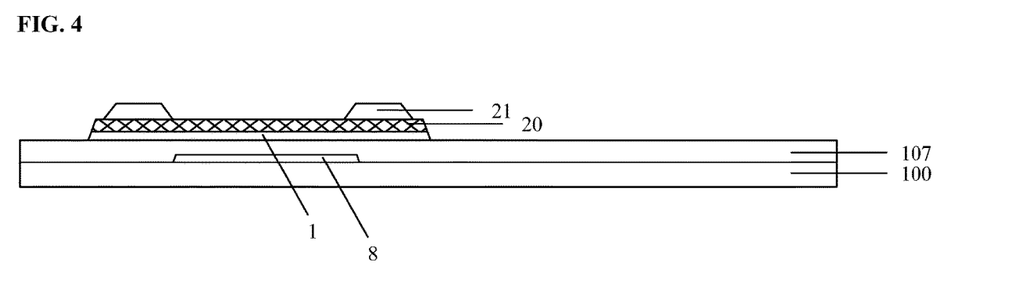
Figure 5:
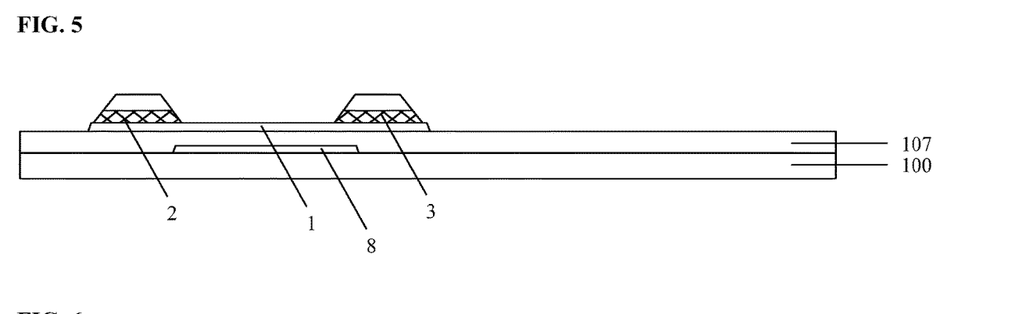

Further, photoresist of the photoresist-partially-retaining region is removed by an ashing process, as shown in FIG. 4. Then, a portion of the source-drain metal layer having an orthogonal projection on the substrate overlapping with the orthogonal projection of the photoresist-partially-retaining region on the substrate is removed by an etching process to form a pattern of the source electrode 2 and a pattern of the drain electrode 3, as shown in FIG. 5.

Further, the remaining photoresist is peeled off to expose the source electrode 2 and the drain electrode 3, as shown in FIG. 6.

At S3, the gate insulating layer 101 and the interlayer insulating layer 102 are successively formed over the substrate 100 over which the active layer 1, the source electrode 2, and the drain electrode 3 have been formed, through a film-forming process, e.g., deposition, or coating. The interlayer insulating layer 102 is patterned to form a first window 10 in the interlayer insulating layer 102 to expose the gate insulating layer 101, as shown in FIG. 7.

Each of the gate insulating layer 101 and the interlayer insulating layer 102 may have, for example, a monolayer structure or a composite layer structure. The gate insulating layer 101 and the interlayer insulating layer 102 may be made of, for example, one or more of silicon nitride, silicon oxide, silicon oxynitride, or another insulating material.

In some embodiments the gate insulating layer 101 may be made of, for example, silicon nitride or silicon oxide, and may have a thickness of approximately 400 Å to approximately 800 Å. In some embodiments, the interlayer insulating layer 102 may be made of, for example, silicon nitride, and may have a thickness of approximately 1000 Å to approximately 3000 Å. In some other embodiments, the interlayer insulating layer 102 may be made of, for example, silicon oxide, and may have a thickness of approximately 2000 Å to approximately 6000 Å. The layered structure containing the gate insulating layer 101 and the interlayer insulating layer 102 may ensure a good etching selectivity between the gate insulating layer 101 and the interlayer insulating layer 102.

Figure 7:
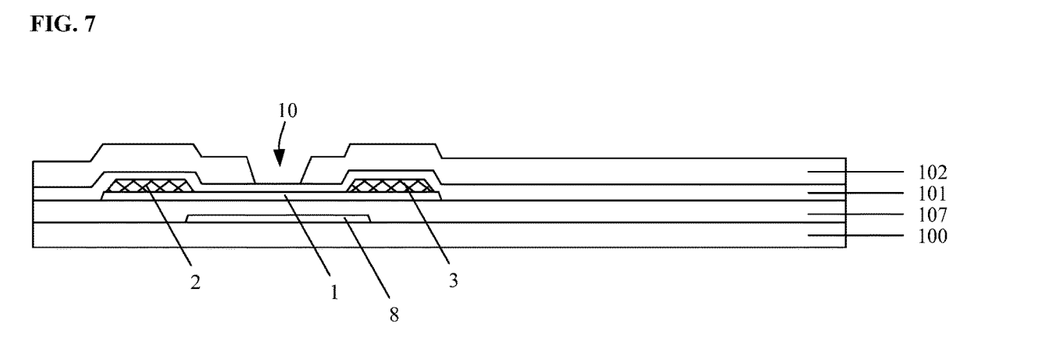
Figure 8:
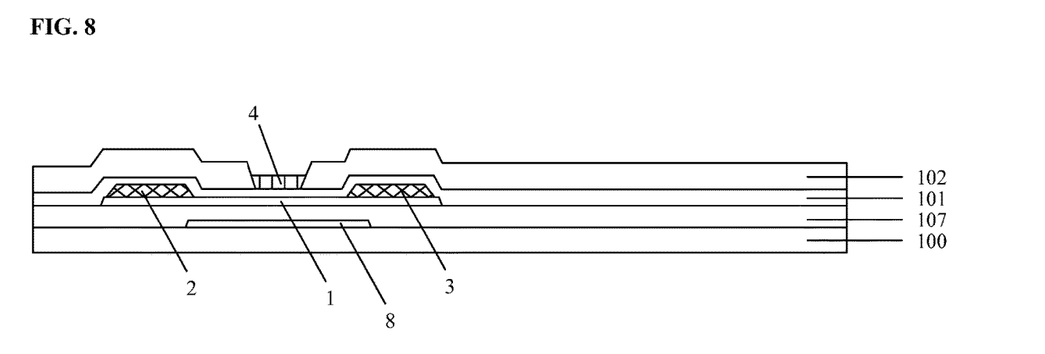

At S4, a gate electrode 4 is formed in the first window 10, as shown in FIG. 7 and FIG. 8.

In some embodiments, forming the gate electrode may include, for example, the following. A gate electrode metal layer is formed by, for example, deposition. A photoresist is coated over the gate electrode metal layer. The photoresist is processed by, for example, an exposure and developing process or an ashing process, to form a pattern of the photoresist. The pattern of the photoresist includes a photoresist-retaining region, and a photoresist-free region. The photoresist-free region refers to a region without photoresist as a result of, e.g., being fully exposed during the exposure process. The photoresist-retaining region refers to a region with remaining photoresist as a result of, e.g., being not exposed during the exposure process under a protection of the mask. The photoresist-retaining region corresponds to the region where the gate electrode is located. That is, an orthogonal projection of the photoresist-retaining region on the substrate overlaps with an orthogonal projection of the region where the gate electrode is located on the substrate. The photoresist-free region corresponds to other regions, i.e., regions other than the region where the gate electrode is located. That is, an orthogonal projection of the photoresist-free region on the substrate overlaps with orthogonal projections of other regions on the substrate. A portion of the gate electrode metal layer corresponding to the photoresist-free region is removed by an etching process. The portion of the gate electrode metal layer corresponding to the photoresist-free region refers to a portion of the gate electrode metal layer having an orthogonal projection on the substrate overlapping with the orthogonal projection of the photoresist-free region on the substrate. Further, the remaining photoresist is peeled off to expose the gate electrode 4, as shown in FIG. 8.

Figure 9:
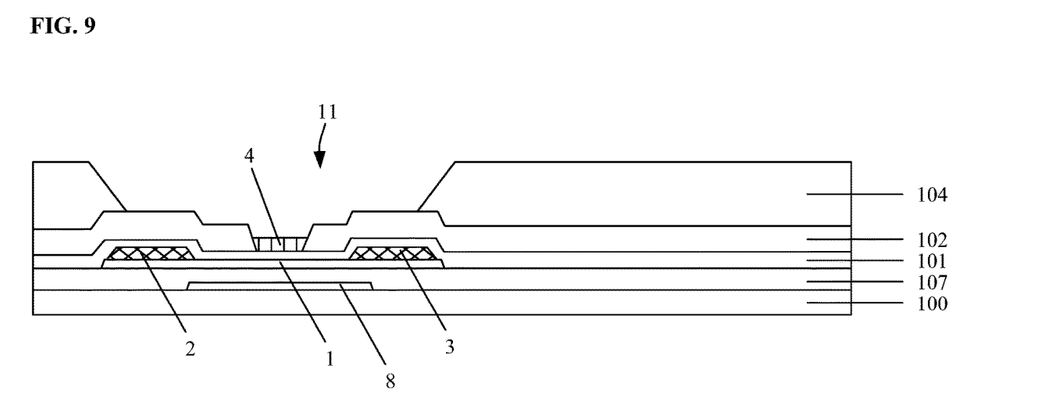

At S5, an organic insulating layer 104 is formed over the substrate 100 over which the gate electrode 4 has been formed. The organic insulating layer 104 is patterned, and a second window 11 is formed in the organic insulating layer 104 that includes portions directly above at least a portion of the source electrode 2 of the thin film transistor and at least a portion of the drain electrode 3 of the thin film transistor, as shown in FIG. 9.

After the gate electrode 4 is formed, a source region of the active layer 1 in contact with the source electrode 2 and a drain region of the active layer 1 in contact with the drain electrode 3 may be doped. In some embodiments, a portion of the active layer 1 near the drain region may be lightly doped.

Figure 10:
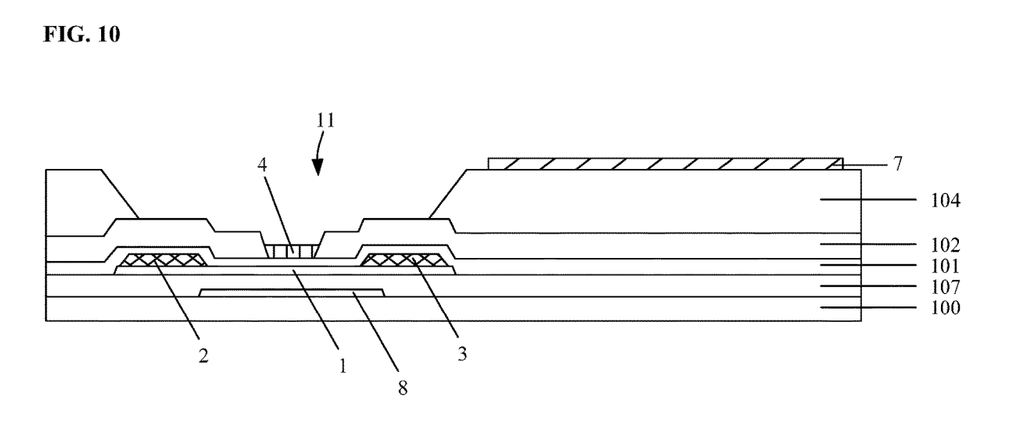

At S6, a common electrode 7 is formed over the organic insulating layer 104, as shown in FIG. 10.

Figure 11:
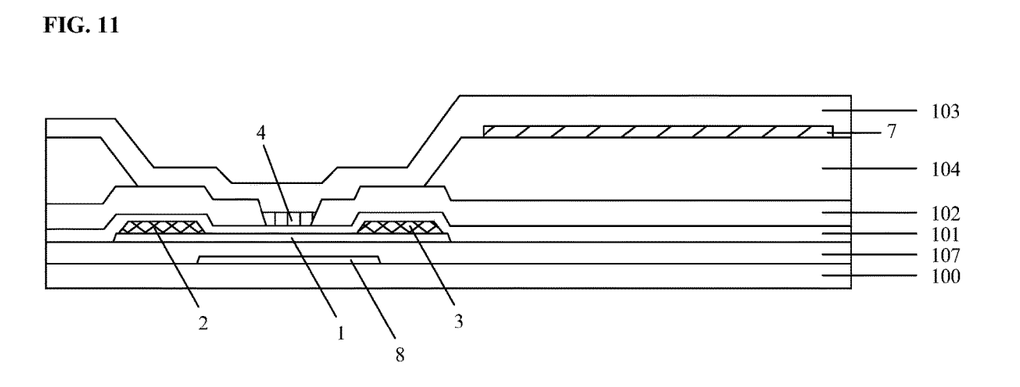

At S7, a passivation layer 103 is formed over the substrate 100 over which the common electrode 7 has been formed, as shown in FIG. 11.

At S8, the first via hole 12 and the second via hole 13 penetrating through the passivation layer 103, the interlayer insulating layer 102, and the gate insulating layer 101 are formed, through one etching process, e.g., dry etching, as shown in FIG. 12.

At S9, a pixel electrode 5 and a first electrode 6 are formed over the substrate 100 over which the first via hole 12 and the second via hole 13 have been formed. The pixel electrode 5 is electrically coupled to the drain electrode 3 through the first via hole 12, and the first electrode 6 is electrically coupled to the source electrode 2 through the second via hole 13, as shown in FIG. 13.

In some embodiments, the pixel electrode 5 and the first electrode 6 may be formed by patterning a same transparent conductive layer. The first electrode 6 may be configured to input a test signal to facilitate testing of a product quality.

A material of the source electrode 2, a material of the drain electrode 3, and a material of the gate electrode 4 may include, for example, a metal such as Cu, Al, Ag, Mo, Cr, Nd, Ni, Mn, Ti, Ta, or W, or an alloy formed by two or more selected from the group consisting of Cu, Al, Ag, Mo, Cr, Nd, Ni, Mn, Ti, Ta, and W. The source electrode 2, the drain electrode 3, and the gate electrode can include a monolayer structure or a multi-layer structure. The multi-layer structure can include, for example, Cu\Mo, Ti\Cu\Ti, or Mo\Al\Mo. The pixel electrode 5 and the common electrode 7 may be made of, for example, a transparent conductive material, such as HIZO, ZnO, TiO2, CdSnO, MgZnO, IGO, IZO, ITO, or IGZO.

The above processes can also be adjusted according to various application scenarios, all of which are within the scope of the present disclosure. For example, a positional relationship between the pixel electrode and the common electrode can be adjusted, and the common electrode can be disposed directly in contact with the substrate, all of which are within the scope of the present disclosure.

The present disclosure provides a thin film transistor, fabricated using the fabrication method consistent with the present disclosure. As shown in, e.g., FIG. 13, the thin film transistor includes the active layer 1, the source electrode 2, and the drain electrode 3 arranged over the substrate 100. The source electrode 2 and the drain electrode 3 are disposed in contact with a surface of the active layer 1 that faces away from the substrate 100. Further, orthogonal projections of the source electrode 2 and the drain electrode 3 on the substrate 100 are within an orthogonal projection of the active layer 1 on the substrate 100.

The above-described active layer, source electrode, and drain electrode of the thin film transistor may be obtained through one patterning process, and thus there is no need for another patterning process. That is, the number of patterning processes can be reduced. Accordingly, the number of masks can be reduced, the fabrication process can be simplified, and the production cost can be reduced.

In some embodiments, the technical solution of the present disclosure may be applicable to a top gate type thin film transistor. In some other embodiments, the technical solution of the present disclosure may be applicable to a bottom gate type thin film transistor.

In some embodiments, when the thin film transistor is a top gate type thin film transistor, the thin film transistor may further include the gate insulating layer 101 and the interlayer insulating layer 102 arranged over the gate insulating layer 101. The gate insulating layer 101 covers the active layer 1, the source electrode 2, and the drain electrode 3. The interlayer insulating layer 102 includes the first window formed through the interlayer insulating layer 102 and till the gate insulating layer 101. The gate electrode 4 is arranged within the first window and has an orthogonal projection on the substrate 100 located within an orthogonal projection of the active layer 1 on the substrate 100.

In the above-described top gate type thin film transistor, an interlayer insulating layer may be added between the gate electrode and the source/drain electrodes, thereby reducing a parasitic capacitance between the gate electrode and the source/drain electrodes.

In some embodiments, the thin film transistor may further include a patterned light-blocking layer 8 arranged over the substrate 100. The patterned light-blocking layer 8 may be arranged at one side of the active layer 1 that is near to the substrate 100. Further, an orthogonal projection of a portion of the active layer 1 between the source electrode 2 and the drain electrode 3 on the substrate 100 may be located within an orthogonal projection of the light-blocking layer 8 on the substrate 100. In some other embodiments, an orthogonal projection of the entire active layer 1 on the substrate 100 may be located within an orthogonal projection of the light-blocking layer 8 on the substrate 100. The one side of the active layer 1 that is near to the substrate 100 faces away from the source electrode 2 and the drain electrode 3. The light-blocking layer 8 can block light coming from the side of active layer 1 facing away from the source electrode 2 and the drain electrode 3, such that the light may not irradiate at least the portion of the active layer between the source electrode and the drain electrode (or, in some embodiments, may not irradiate the entire active layer), and the semiconductor property of the active layer 1 may not be influenced by light irradiation.

In some embodiments, a buffer layer 107 is provided between the light-blocking layer 8 and the active layer 1 for preventing the light-blocking layer 8 from influencing the semiconductor property of the active layer 1.

The present disclosure also provides a display substrate including the thin film transistor consistent with the present disclosure. In the display substrate of the present disclosure, the active layer, the source electrode, and the drain electrode of the thin film transistor may be formed through one patterning process, and thus there is no need for another patterning process. That is, the number of patterning processes can be reduced. Accordingly, the number of masks can be reduced, the fabrication process can be simplified, and the production cost can be reduced.

In some embodiments, when the display substrate is a thin film transistor array substrate, as shown in FIG. 13, the display substrate may further include a passivation layer 103 arranged over the thin film transistor; and a pixel electrode 5 and a first electrode 6 arranged over the passivation layer 103. The pixel electrode 5 and the first electrode 6 may be arranged in a same layer, for example, being formed from a same layer of conducting material.

The pixel electrode 5 is electrically coupled to the drain electrode 3 through the first via hole 12 that penetrates through the passivation layer 103, the interlayer insulating layer 102, and the gate insulating layer 101. The first electrode 6 is electrically coupled to the source electrode 2 through the second via hole 13 that penetrates through the passivation layer 103, the interlayer insulating layer 102, and the gate insulating layer 101.

In the above-described array substrate of thin film transistor, the first via hole and the second via hole penetrating through the passivation layer, the interlayer insulating layer, and the gate insulating layer may be formed by one etching process, such that the number of masks used in the fabrication process can be reduced. Further, when the pixel electrode is formed, the first electrode electrically coupled to the source electrode may be formed for testing purposes. In the present disclosure, contact structures of the source electrode and the drain electrode arranged over the active layer can reduce a lap resistance between the pixel electrode and the drain electrode, and can reduce a thickness difference. Accordingly, defects can be reduced in a subsequent etching process.

In some embodiment, for an array substrate of a transverse electric field type thin film transistor, as shown in FIG. 13, the display substrate may further include the organic insulating layer 104 disposed over the thin film transistor, the passivation layer 103 disposed over the organic insulating layer 104, and the common electrode 7 disposed between the organic insulating layer 104 and the passivation layer 103. The organic insulating layer 104 has a second window to expose at least a portion of a region where the source electrode 2 of the thin film transistor is located and at least a portion of a region where the drain electrode 3 of the thin film transistor is located.

In the display substrate of the present disclosure, a second window may be provided in an organic insulating layer between the thin film transistor and the common electrode in order to expose at least a portion of a region where the source electrode of the thin film transistor is located and at least a portion of a region where the drain electrode of the thin film transistor is located. Accordingly, a thickness of the insulating layer between the pixel electrode and the drain electrode may be not increased, and a quality of the via hole penetrating through the passivation layer, the interlayer insulating layer and the gate insulating layer may be ensured.

Although only one exemplary thin film transistor is shown in the exemplary display substrate shown in FIG. 13, which is merely for illustration purposes, the display substrate consistent with the present disclosure, such as the exemplary display substrate shown in FIG. 13, can include a plurality of thin film transistors.

The present disclosure also provides a display device including the display substrate consistent with the present disclosure to simplify a fabrication process, and to reduce a production cost.

Figure 15:
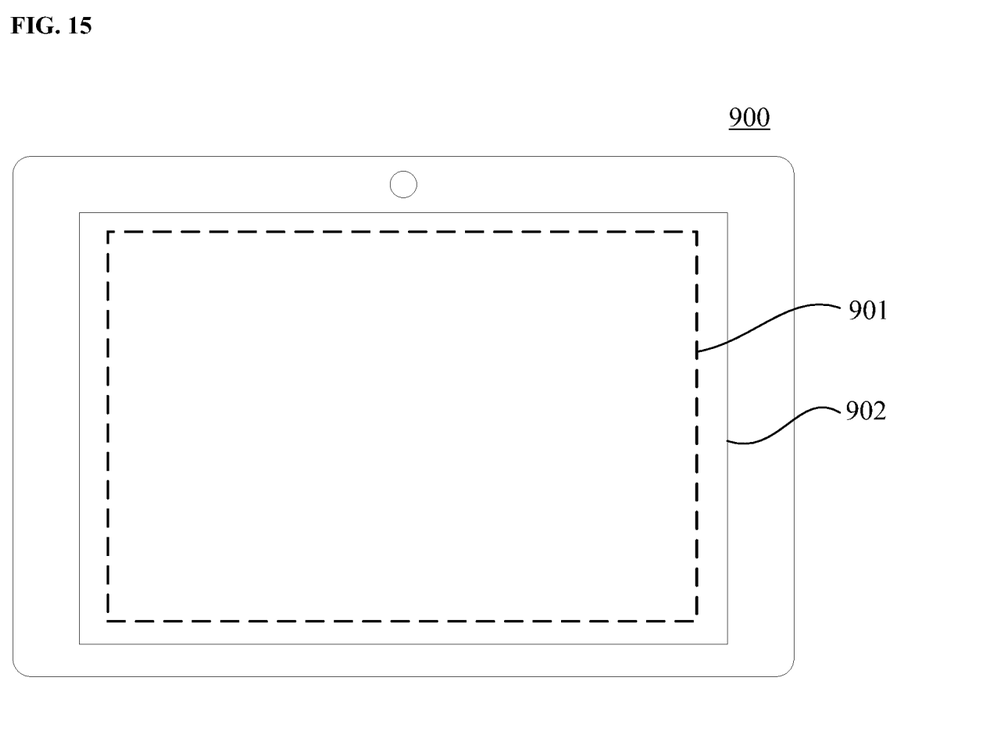
FIG. 15 illustrates a schematic view of an exemplary display device according to various disclosed embodiments of the present disclosure.

FIG. 15 illustrates a schematic view of an exemplary display device according to various disclosed embodiments of the present disclosure. As shown in FIG. 15, the display device 900 includes a display substrate 901 consistent with the disclosure. The display substrate 901 can be, for example, any one of the above-described exemplary display substrates. The display device 900 may further include other suitable structures. For example, the display device 900 may include a display panel 902, which further includes the display substrate 901. The display device can be, for example, a liquid crystal display device, an organic electroluminescent display device, or other suitable display device. Any display device including a display substrate consistent with the disclosure is within the scope of the present disclosure The present disclosure provides a thin film transistor and a display substrate, a fabrication method thereof, and a display device. With the fabrication method of the disclosure, an active layer, a source electrode, and a drain electrode of the thin film transistor can be formed through one patterning process. Therefore, the number patterning process can be reduced. Accordingly, the number of masks can be reduced, the fabrication process can be simplified, and the production cost can be reduced.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A method for fabricating a display substrate, comprising a method for fabricating a thin film transistor, the method for fabricating the thin film transistor comprising:
    providing a substrate;
    forming a semiconductor layer over the substrate;
    forming a source-drain metal layer over the semiconductor layer;
    applying one patterning process to the semiconductor layer and the source-drain metal layer to form an active layer, a source electrode, and a drain electrode;
    forming a gate insulating layer and an interlayer insulating layer that cover the active layer, the source electrode, and the drain electrode;
    applying a patterning process to the interlayer insulating layer to form a first window in the interlayer insulating layer to expose a portion of the gate insulating layer; and
    forming a gate electrode in the first window, an orthogonal projection of the gate electrode on the substrate being in an orthogonal projection of the active layer on the substrate; and
    wherein the method for fabricating the display substrate further comprises:
    forming a passivation layer over the thin film transistor;
    forming a first via hole and a second via hole penetrating through the passivation layer, the interlayer insulating layer, and the gate insulating layer;
    forming a transparent conductive layer over the passivation layer and in the first via hole and the second via hole; and
    patterning the transparent conductive layer to form a pixel electrode and a first electrode, the pixel electrode being electrically coupled to the drain electrode through the first via hole and the first electrode being electrically coupled to the source electrode through the second via hole.

2. The method according to claim 1, wherein the method for fabricating the thin film transistor further comprising, before forming the semiconductor layer and the source-drain metal layer:
    forming a patterned light-blocking layer over the substrate, the orthogonal projection of a portion of the active layer between the source electrode and the drain electrode on the substrate being in an orthogonal projection of the light-blocking layer on the substrate.

3. The method according to claim 2, wherein the method for fabricating the thin film transistor further comprising:
    forming a buffer layer over the light-blocking layer;
    wherein forming the semiconductor layer includes:
        forming an amorphous silicon layer over the buffer layer; and
        processing the amorphous silicon layer to form a polysilicon layer as the semiconductor layer.

4. The method according to claim 3, wherein processing the amorphous silicon layer includes:
    applying a dehydrogenation process and an excimer laser annealing process to the amorphous silicon layer to form the polysilicon layer as the semiconductor layer.

5. The method according to claim 1, further comprising, before forming the passivation layer:
    forming an organic insulating layer over the thin film transistor;
    patterning the organic insulating layer to form a second window, a portion of the second window being directly above at least a portion of a region where the source electrode of the thin film transistor is located and another portion of the second window being directly above at least a portion of a region where the drain electrode of the thin film transistor is located; and
    forming a common electrode over the organic insulating layer.

6. A display substrate comprising a thin film transistor, the thin film transistor comprising:
    a substrate;
    an active layer over the substrate;
    a source electrode and a drain electrode over the substrate, wherein:
        the source electrode and the drain electrode are disposed over a surface of the active layer facing away from the substrate, and
        orthogonal projections of the source electrode and the drain electrode on the substrate are in an orthogonal projection of the active layer on the substrate;

a gate insulating layer covering the active layer, the source electrode, and the drain electrode;

an interlayer insulating layer over the gate insulating layer, the interlayer insulating layer having a first window exposing a portion of the gate insulating layer; and a gate electrode in the first window, an orthogonal projection of the gate electrode on the substrate being located in the orthogonal projection of the active layer on the substrate;

wherein the display substrate further comprises:

a passivation layer over the thin film transistor; and a pixel electrode and a first electrode in a same layer and over the passivation layer, wherein:

the pixel electrode is electrically coupled to the drain electrode through a first via hole penetrating through the passivation layer, the interlayer insulating layer, and the gate insulating layer, and the first electrode is electrically coupled to the source electrode through a second via hole penetrating through the passivation layer, the interlayer insulating layer, and the gate insulating layer.

7. The display substrate according to claim 6, further comprising:

an organic insulating layer arranged over the thin film transistor and beneath the passivation layer, the organic insulating layer having a second window including a portion directly above at least a portion of a region where the source electrode of the thin film transisto is located and another portion directly above at least a portion of a region where the drain electrode of the thin film transistor is located; and a common electrode between the organic insulating layer and the passivation layer.

8. A display device comprising the display substrate according claim 6.

* * * * *